(12) United States Patent
Tsuji et al.

(10) Patent No.: US 8,912,101 B2
(45) Date of Patent: Dec. 16, 2014

(54) METHOD FOR FORMING SI-CONTAINING FILM USING TWO PRECURSORS BY ALD

(71) Applicant: ASM IP Holding B.V., Almere (NL)

(72) Inventors: Naoto Tsuji, Tokyo (JP); Atsuki Fukazawa, Tama (JP); Noboru Takamure, Kawasaki (JP); Suvi Haukka, Helsinki (FI); Antti Juhani Niskanen, Helsinki (FI); Hyung Sang Park, Seoul (KR)

(73) Assignee: ASM IP Holding B.V., Almere (NL)

(*) Notice: Subject to any disclaimer, the term of this patent is extended or adjusted under 35 U.S.C. 154(b) by 14 days.

(21) Appl. No.: 13/799,708

(22) Filed: Mar. 13, 2013

(65) Prior Publication Data

US 2013/0244446 A1    Sep. 19, 2013

Related U.S. Application Data

(60) Provisional application No. 61/611,477, filed on Mar. 15, 2012.

(51) Int. Cl.
| | |
|---|---|
| *H01L 21/31* | (2006.01) |
| *H01L 21/469* | (2006.01) |
| *H01L 21/02* | (2006.01) |
| *C23C 16/32* | (2006.01) |
| *C23C 16/34* | (2006.01) |
| *C23C 16/455* | (2006.01) |
| *H01L 21/768* | (2006.01) |

(52) U.S. Cl.
CPC .......... *H01L 21/0228* (2013.01); *C23C 16/325* (2013.01); *C23C 16/345* (2013.01); *C23C 15/45534* (2013.01); *C23C 16/4554* (2013.01); *H01L 21/02164* (2013.01); *H01L 21/02167* (2013.01); *H01L 21/0217* (2013.01); *H01L 21/02211* (2013.01); *H01L 21/02274* (2013.01); *H01L 21/76829* (2013.01)
USPC ....................................................... 438/782

(58) Field of Classification Search
CPC .... C23C 16/401; C23C 16/345; C23C 14/08; C23C 16/308; C23C 16/235; C23C 16/4554; C23C 16/325; C23C 16/45534; H01L 21/02164; H01L 21/02219; H01L 21/02222; H01L 21/02271; H01L 21/28167; H01L 21/28194; H01L 21/3125; H01L 21/30; H01L 21/3003; H01L 21/3141; H01L 21/3142; H01L 21/02208; H01L 21/02211; H01L 21/0228; H01L 21/02274; H01L 21/76829; H01L 21/0217
USPC .................................................. 438/778, 782
See application file for complete search history.

(56) References Cited

U.S. PATENT DOCUMENTS

| | | |
|---|---|---|
| 6,528,430 B2 | 3/2003 | Kwan |
| 7,713,874 B2 * | 5/2010 | Milligan .................. 438/680 |

(Continued)

OTHER PUBLICATIONS

Stefan Schmatz, Bernd Fredelake, Michael Jendras, and Uwe Klingebiel, Unusual Isomerization Reactions in 1,3-Diaza-2-silacyclopentanes, Organometallics Feb. 18, 2004, 23, pp. 1180-1182.*

*Primary Examiner* — Colleen A Matthews
*Assistant Examiner* — Quovaunda V Jefferson
(74) *Attorney, Agent, or Firm* — Snell & Wilmer L.L.P.

(57) ABSTRACT

A method for forming a silicon-containing dielectric film on a substrate by atomic layer deposition (ALD) includes: providing two precursors, one precursor containing a halogen in its molecule, another precursor containing a silicon but no halogen in its molecule, adsorbing a first precursor, which is one of the two precursors onto a substrate to deposit a monolayer of the first precursor; adsorbing a second precursor, which is the other of the two precursors onto the monolayer of the first precursor to deposit a monolayer of the second precursor; and exposing the monolayer of the second precursor to radicals of a reactant to cause surface reaction with the radicals to form a compound monolayer of a silicon-containing film.

17 Claims, 2 Drawing Sheets

(56) References Cited

U.S. PATENT DOCUMENTS

| | | | |
|---|---|---|---|
| 2009/0041984 A1* | 2/2009 | Mayers et al. | 428/141 |
| 2010/0041243 A1* | 2/2010 | Cheng et al. | 438/778 |
| 2011/0159673 A1* | 6/2011 | Hanawa et al. | 438/558 |
| 2011/0256726 A1* | 10/2011 | LaVoie et al. | 438/702 |
| 2011/0283933 A1* | 11/2011 | Makarov et al. | 117/88 |
| 2012/0214318 A1* | 8/2012 | Fukazawa et al. | 438/786 |

* cited by examiner

US 8,912,101 B2

METHOD FOR FORMING SI-CONTAINING FILM USING TWO PRECURSORS BY ALD

CROSS-REFERENCE TO RELATED APPLICATIONS

This is an application for patent which claims the benefit of U.S. Provisional Application No. 61/611,477, filed Mar. 15, 2012, under 35 USC 119(e), the disclosure of which is herein incorporated by reference in its entirety.

BACKGROUND OF THE INVENTION

1. Field of the Invention

The present invention generally relates to atomic layer deposition (ALD) technology, particularly, to a method for depositing a silicon-containing film using two precursors by ALD.

2. Description of the Related Art

Conventionally, in the field of semiconductor manufacturing, a high-quality thin film is deposited on a substrate typically by chemical vapor deposition (CVD). Recently, in connection with development of super fine semiconductor devices, ALD technology, wherein a thin film is formed on a substrate by laminating atomic layers one by one, has been examined. In ALD, a gas-phase source gas is introduced to a chamber wherein a substrate is placed, and approximately one molecule in thickness is chemisorbed to a surface of the substrate. The gas-phase source gas is then purged from the chamber, and for example, an oxygen source for forming an oxide film or a nitrogen source gas for forming a nitride film is introduced, thereby causing reaction with the source gas chemisorbed on the surface of the substrate and forming a thin layer composed typically of less than one molecular layer in thickness. The reaction gas is then purged from the chamber, and the above steps are repeated to form a thin film having a desired thickness.

As described above, because ALD utilizes chemisorptions of a source gas on a surface of a substrate, ALD is characterized by excellent step coverage, and a good film can be formed at a temperature of 300 to 650° C. or a temperature lower than the foregoing. Thus, ALD is believed to be useful technology not only for forming gate insulation films, but also for forming dielectric films such as SiC films used as an etch stopper for an underlying layer having a complex shape or pattern or as copper diffusion blocking films.

However, because ALD deposits atomic layers one by one by repeating the steps described above, there is a problem of a low throughput of the film forming processes, and when forming a thick film, the steps must be repeated for a high number of times. Further, in ALD, some precursors are not easily chemisorbed on a surface of a substrate. For example, deposition of SiN film is challenging. In practice, the only organosilicon precursors feasible for SiN deposition are those containing no oxygen, and therefore, the prime candidates are silicon alkylamides, which are volatile enough to be used in practical applications, but thermal and also plasma-enhanced ALD of SiN from these precursors has not yet been successful.

In contrast, CVD, which has been used for forming similar films, is capable of efficiently forming a film in an extremely short amount of time by introducing both a gas-phase source gas and a reactant gas to a chamber. However, when a thin film is formed by plasma CVD on a semiconductor circuit having irregular surfaces, the step coverage is normally as low as about 70%. Further, as semiconductor devices become finer, an aspect ratio, which is a ratio of opening size to depth of the opening, becomes larger, and thus, the step coverage of films by CVD is expected to be even lower than today. Further, for example, when a SiN film is formed at least partially by CVD, material properties of the film tend to be changed in trenches.

In the present invention, one object, among others, is providing a method of forming a film in which a low throughput, which is a shortcoming of ALD, is improved.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

An embodiment provides a method for forming a silicon-containing dielectric film on a substrate by atomic layer deposition (ALD), comprising: (i) providing two precursors for forming a silicon-containing film, one precursor containing a halogen in its molecule, another precursor containing a silicon but no halogen in its molecule, said two precursors being reactive with each other; (ii) adsorbing a first precursor, which is one of the two precursors without the other of the two precursors, onto a substrate to deposit a monolayer of the first precursor; (iii) then adsorbing a second precursor, which is the other of the two precursors without the one of the two precursors, onto the monolayer of the first precursor to deposit a monolayer of the second precursor, wherein no reactant radicals are supplied over the substrate between steps (ii) and (iii); (iv) exposing the monolayer of the second precursor to radicals of a reactant to cause surface reaction with the radicals to form a compound monolayer of a silicon-containing film; and (v) repeating steps (ii) to (iv), which constitute one cycle of ALD, to form a silicon-containing dielectric film composed of multiple compound monolayers.

According to the above embodiment, in one cycle of ALD, more than one monolayer can be deposited by using two certain precursors which are reactive with each other without a reactant, thereby improving a growth rate per cycle.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
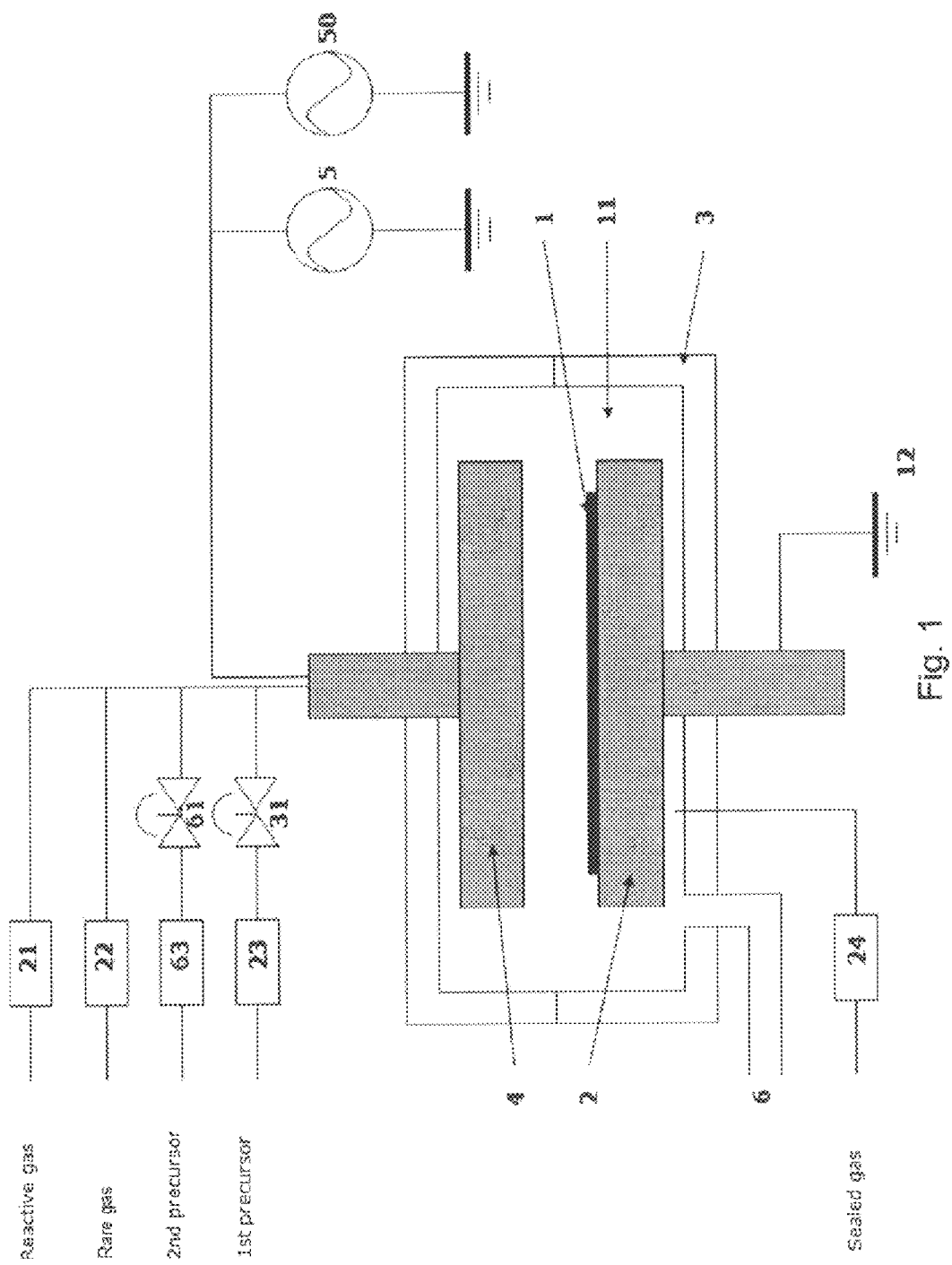
FIG. 1 is a schematic representation of a PEALD apparatus for depositing a dielectric layer usable for an embodiment of the present invention.

In this disclosure, a "gas" may include vaporized solid and/or liquid and may be constituted by a mixture of gases. Further, "a" refers to a species or a genus including multiple species, in this disclosure, the first precursor, the second precursor, and the reactant gas are different from each other or mutually exclusive in terms of gas types, i.e., there is no overlap of gas types among these categories. Gases can be supplied in sequence with or without overlap according to embodiments. Further, in this disclosure, any two numbers of a variable can constitute an applicable range of the variable, and any ranges indicated may include or exclude the endpoints.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, a "monolayer" of a gas refers to a unit layer formed from the gas per cycle of ALD, and a "compound monolayer" of a material refers to a unit layer constituted by the material and formed per cycle of ALD, which is comprised of two monolayers of respective gases and which is a repeating unit layer in some embodiments.

In the present disclosure where conditions and/or structures are not specified, the skilled artisan in the art can readily provide such conditions and/or structures, in view of the present disclosure, as a matter of routine experimentation. Also, in the present disclosure including the examples described later, the numbers applied in specific embodiments can be modified by a range of at least ±50% in some embodiments, and the ranges applied in some embodiments may include or exclude the lower and/or upper endpoints. Further, the numbers include approximate numbers, and may refer to average, median, representative, majority, etc. in some embodiments.

In all of the disclosed embodiments, any element used in an embodiment can interchangeably or additionally be used in another embodiment unless such a replacement is not feasible or causes adverse effect or does not work for its intended purposes. Further, the present invention can equally be applied to apparatuses and methods.

In this disclosure, any defined meanings do not necessarily exclude ordinary and customary meanings in some embodiments.

In some embodiments, a method for forming a silicon-containing dielectric film on a substrate by atomic layer deposition (ALD) comprises: (i) providing two precursors for forming a silicon-containing film, one precursor containing a halogen in its molecule, another precursor containing a silicon but no halogen in its molecule, said two precursors being reactive with each other; (ii) adsorbing a first precursor, which is one of the two precursors without the other of the two precursors, onto a substrate to deposit a monolayer of the first precursor; (iii) then adsorbing a second precursor, which is the other of the two precursors without the one of the two precursors, onto the monolayer of the first precursor to deposit a monolayer of the second precursor, wherein no reactant radicals are supplied over the substrate between steps (ii) and (iii); (iv) exposing the monolayer of the second precursor to radicals of a reactant to cause surface reaction with the radicals to firm a compound monolayer of a silicon-containing film; and (v) repeating steps (ii) to (iv), which constitute one cycle of ALD, to form a silicon-containing dielectric film composed of multiple compound monolayers. In the above, before reactant radicals are supplied on the surface of the substrate, a compound monolayer is formed, which has a thickness greater than a one-molecule thickness (theoretically about a two-molecule thickness), normally about 1.1 to about 3 times (typically about 1.3 to about 2 times) thicker than the one-molecule thickness of the first precursor, depending on the type of the second precursor, i.e., the growth rate per cycle (GPC) is normally about 1.1 to about 3 times (typically about 1.3 to about 2 times) higher when the first and second precursors are used than that when only one precursor is used. In some embodiments, GPC when using the two precursors is about 0.04 nm/cycle or higher, typically about 0.05 to about 0.1 nm/cycle.

In some embodiments, the method further comprises removing a non-adsorbed portion of the first precursor from the surface of the substrate after step (ii) before step (iii), removing a non-adsorbed portion of the second precursor from the surface of the substrate after step (iii) before step (iv), and removing a non-reacted portion of the reactant from the surface of the substrate after step (iv) before subsequent step (ii).

In some embodiments, the one precursor can be a precursor having no silicon in its molecule. In some embodiments, the one precursor is a precursor containing a silicon in its molecule. In some embodiments, the one precursor is a silicon halide $Si_nX_{2n+2}$, wherein n is an integer, preferably from 1 to 2 and X is a halide ion (F, Cl, Br, I) or halide containing silane such as $SiBr_4$, $Si_2Br_6$, $SiCl_4$, $Si_2Cl_6$, $Si_3Cl_8$, $SiF_4$, $Si_2F_6$, $SiI_4$, and $Si_2I_6$. In some embodiments, the one precursor is a silicon halide. In some embodiments, the one precursor is a precursor containing a silicon and hydrocarbon in its molecule. In some embodiments, the one precursor is a precursor containing a silicon, halide and hydrocarbon in its molecule and, for example, a halide-containing alkylsilane, such as dichlorotetramethyldisilane. In some embodiments, the one precursor is at least one precursor selected from the group consisting of dichloromethylsilane, tetrachlorodimethyldisilane, dichlorotetramethyldisilane, bisdichloromethylsilylethane, chloromethyldichloromethylsilane, bisdimethylchlorosilylethane, bisdichloromethylsilylethane, chloromethyltrimethylsilane, and bischloromethyldimethyl silane.

In some embodiments, the one precursor is either the first precursor or second precursor, depending on the first and second precursors' capability of chemisorption to a surface and their reactivity with each other, the target film, deposition conditions, etc. For example, in some embodiments, the one precursor is the first precursor, and the embodiments are particularly effective for forming a SiN film. As discussed in the Background Art section, for forming a SiN film, the prime candidates are silicon alkylamides, which are volatile enough to be used in practical applications, but formation of a SiN film by plasma-enhanced ALD (PEALD) has not yet been successful. One of the main reasons why the direct deposition of SiN from silicon alkylamides and NH3 or N2+H2 plasma is quite challenging is believed to be the unfavorable chemisorption step (a Si precursor adsorbs onto the surface of a substrate). The silicon alkylamides may not chemisorb on an —NHx surface. In contrast, SiN from silicon halides (e.g., Si2Cl6 and Si3Cl8) and NH3 or N2+H2 plasma results in a good growth rate, and the deposited material can be confirmed to be SiN (a composition analysis pending FTIR shows Si—N bonding). Unlike silicon alkylamides, silicon halides do not suffer from poor chemisorption capability on an —NH$_x$ covered surface. Thus, by using a halide precursor to chemisorb to the —NHx surface, a second precursor such as a silicon alkylamide can react with the halide chemisorbed surface. In other embodiments, the one precursor is the second precursor.

In some embodiments, the other precursor is a silane derivative having a formula $(R^I R^{II}—N)_x SiH_{4-x}$, wherein x is from 1 to 4, $R^I$ is hydrogen or a $C_1$-$C_{10}$ cyclic or branched alkyl, aryl, alkynyl or alkenyl group, $R^{II}$ is a $C_1$-$C_{10}$ linear, cyclic or branched alkyl, aryl, alkynyl or alkenyl group, in some embodiments, $R^I$ and $R^{II}$ are each preferably a $C_1$-$C_6$ linear, cyclic or branched alkyl, aryl, alkynyl or alkenyl group and more preferably a $C_1$-$C_4$ linear, cyclic or branched alkyl, alkynyl or alkenyl group. In some embodiments, $R^I$ and $R^{II}$ can each be a $C_2$ alkyl, alkynyl or alkenyl group. In some embodiments, $R^I$ and $R^{II}$ can each be methyl. In some embodiments, $R^I$ and $R^{II}$ are each a $C_3$-$C_4$ alkyl, alkynyl or alkenyl group. $R^I$ and $R^{II}$ can each be substituted with halides, amino- or silyl groups, and $R^I$ and $R^{II}$ can be selected independently of each other; for example, one of $R^I$ and $R^{II}$ can be methyl and the other of $R^I$ and $R^{II}$ can be ethyl.

In some embodiments, the other precursor is a disilane derivative having a formula $(R^I R^{II}—N)_x H_{3-x} Si—SiH_{3-x}(N—R^I R^{II})_x$, wherein x is from 1 to 3, $R^I$ is hydrogen or a $C_1$-$C_{10}$ linear, cyclic or branched alkyl, aryl, alkynyl or alkenyl group, $R^{II}$ is a $C_1$-$C_{10}$ linear, cyclic or branched alkyl, aryl, alkynyl or alkenyl group. In some embodiments, $R^I$ and $R^{II}$ are each preferably a $C_1$-$C_6$ linear, cyclic or branched alkyl, aryl, alkynyl or alkenyl groups and more preferably a $C_1$-$C_4$ linear, cyclic or branched alkyl, alkynyl or alkenyl group. In some embodiments, $R^I$ and $R^{II}$ can each be a $C_2$ alkyl, alkynyl or alkenyl group. In some embodiments, $R^I$ and $R^{II}$ can each be a methyl group. In some embodiments, $R^I$ and $R^{II}$ are each a $C_3$-$C_4$ alkyl, alkynyl or alkenyl group. $R^I$ and $R^{II}$ can each be substituted with halides, amino- or silyl groups, and $R^I$ and $R^{II}$ can be selected independently of each other; for example, one of $R^I$ and $R^{II}$ can be methyl and the other of $R^I$ and $R^{II}$ can be ethyl.

In some embodiments, the order of introducing the one and the other precursors is not limited. For example, when the one precursor has a Si—Cl bond and the other precursor has a Si—CH=CH2 bond, an exchange reaction takes place between —Cl and —CH=CH2, similar to a model of silane coupling, and thus, the order of introducing the two precursors is not significant.

In some embodiments, a film having a refractive index of 1.43 to 1.6 (e.g., SiO), 1.70 to 2.2 SiN), or 1.6 to 2.2 (e.g., SiC) at 633 nm can be deposited, and the one precursor and the other precursor can be selected according to the type of the deposited film, as long as the two precursors can be reactive with each other through, e.g., an exchange reaction described above.

In some embodiments, the other precursor is at least one precursor selected from the group consisting of vinyltrimethylsilane, trimethylsilylacetylene, bistrimethylsilylacetylene, divinyldimethylsilane, and divinyldimethylsilane, which can be used with any of the one precursors disclosed herein.

In some embodiments, the other precursor is a silane derivative having a formula $R_x SiH_{4-x}$, wherein x is from 1 to 4, each R is a $C_1$-$C_{10}$ linear, cyclic or branched alkyl, aryl, alkynyl or alkenyl group. In some embodiments, each R is preferably a $C_1$-$C_6$ linear, cyclic or branched alkyl, aryl, alkynyl or alkenyl group and more preferably a $C_1$-$C_4$ linear, cyclic or branched alkyl, alkynyl or alkenyl group, in some embodiments, each R can be a $C_2$ alkyl, alkynyl or alkenyl group. In some embodiments, each R can be methyl. In some embodiments, each R is a $C_3$-$C_4$ alkyl, alkynyl or alkenyl group. Each R can be substituted with halides, amino-, alkylsilyl- or silyl groups, and R's can be selected independently of each other; for example, one or two R's can be methyl and other R or R's can be vinyl. In some embodiments, x is preferably 4, in preferred embodiments, each R can be methyl, ethyl, ethenyl or ethynyl. In another preferred embodiment, one of the R's can be an alkylsilyl-substituted ethynyl group, such as trimethylsilyl acetylene. In some embodiments, the other precursor is a disilane derivative having a formula $R_x H_{3-x} Si—SiH_{3-x} R_x$, wherein x is from 1 to 3, each R is a $C_1$-$C_{10}$ linear, cyclic or branched alkyl, aryl, alkynyl or alkenyl group. In some embodiments, each R is preferably a $C_1$-$C_6$ linear, cyclic or branched alkyl, aryl, alkynyl or alkenyl groups and more preferably a $C_1$-$C_4$ linear, cyclic or branched alkyl, alkynyl or alkenyl group. In some embodiments, each R can be a $C_2$ alkyl, alkynyl or alkenyl group. In some embodiments, each R can be methyl. In some embodiments, each R is a $C_3$-$C_4$ alkyl, alkynyl or alkenyl group. Each R can be substituted with halides, amino-, alkylsilyl- or silyl groups, and R's can be selected independently of each other; thr example, one or two R's can be methyl and other R or R's can be vinyl. In some embodiments, x is preferably 3.

In some embodiments, the reactant is at least one gas selected from the group consisting of rare gas, hydrogen, nitrogen, ammonia, hydrocarbon, and halogenated carbon. In some embodiments, the reactant is at least one gas selected from the group consisting of $N_2$, He, Ne, Ar, $H_2$, $NH_3$, $C_x F_y$, $C_x Cl_y$, $Cl_3 Br_y$, and $C_x I_y$, wherein x and y are integers. In some embodiments, the radicals are radicals excited by plasma or thermally excited. In some embodiments, the radicals are constituted by hydrogen and nitrogen plasmas. In some embodiments, the reactant comprises $CH_4$. In some embodiments, the reactant comprises $NH_3$. In some embodiments, the reactant comprises a mixture of $N_2$ and $H_2$. In some embodiments, the reactant comprises mixture of $H_2$ and other gas.

Preferably in some embodiments where SiN is deposited, a hydrogen and nitrogen plasma is used, which can be generated by applying RF power to hydrogen gas and nitrogen gas (or NH3) wherein a ratio of hydrogen flow rate to nitrogen flow rate may be adjusted in a range of 5/1 to 1/5, typically 4/1 to 2/1, e.g., approximately 3/1.

In some embodiments, the radicals are radicals excited by plasma generated by RF power having a frequency of 400 kHz to 60 MHz. In some embodiments, a plasma exiting step can be performed using a frequency exceeding 5 MHz, e.g., any one of high RF power of 13.56 MHz, 27 MHz or 60 MHz, in some embodiments; further, any one of the foregoing high RF power and low RF power of 5 MHz or less can be combined wherein a ratio of low-frequency power to high-frequency power may be 0 to 50% or less (e.g., 0 to 30% or less). In some embodiments, the RF power may be applied in the range of approximately 0.02 W/cm$^2$ to approximately 2.0 W/cm$^2$ per area of the substrate (e.g., a range of 0.05-10 W/cm$^2$, a range of 1-5 \V/cm$^2$, and a range of 0.5-3 W/cm$^2$) and the reaction space pressure may be adjusted in the range of approximately 0.1 Torr to approximately 10 Torr (e.g., 2 Torr to 9 Torr).

In some embodiments, the temperature of the substrate is kept at 0° C. to 650° C. (including 100° C. to 500° C., 200° C. to 400° C.) throughout the cycles.

Figure 2:
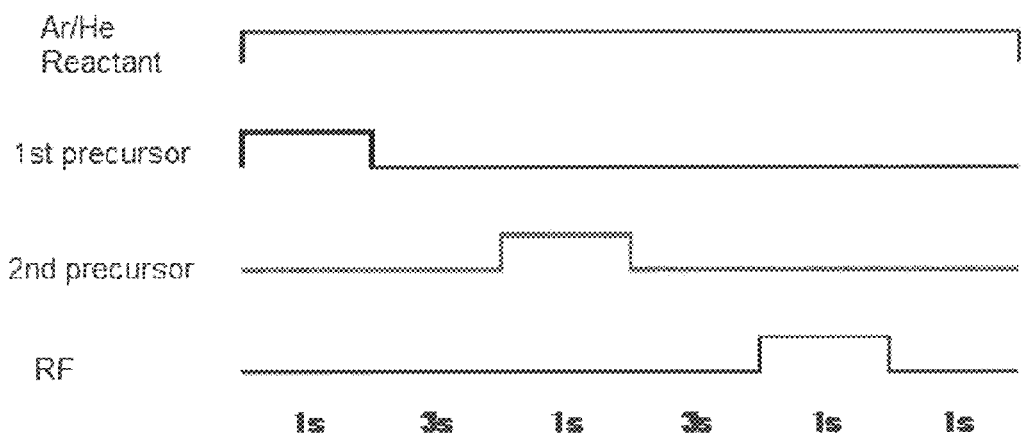
FIG. 2 shows a schematic process sequence of PEALD in one cycle according to an embodiment of the present invention.

FIG. 2 shows a schematic process sequence of PEALD in one cycle according to an embodiment of the present invention. After a substrate is placed on a susceptor in a chamber and the temperature and pressure are adjusted, the ALD sequence starts. After the conditions are stabilized, a reactant gas and, as necessary, a rare gas such as Ar or He are introduced constantly to a chamber throughout a cycle. In some embodiments, the flow rate of a reactant gas is 50~2000 sccm (typically 500~1000 sccm), the flow rate of rare gas is 0~3000 sccm (typically 100~2000 sccm), and the flow rate of seal gas such as He is 200~500 sccm (typically 300~500 sccm). The first precursor is introduced in a pulse to the chamber, in some embodiments, the duration of the pulse of the first precursor is about 0.1 sec to about 2.0 sec, typically about 0.2 sec to about 1.2 sec, whereby the first precursor is chemisorbed onto the surface of the substrate to form a monolayer of the first precursor. In some embodiments, the chamber is then purged using the constantly introduced rare gas and reactant gas for about 1.0 sec to about 4 sec (typically 1.5 sec to 3.5 sec) to remove the non-chemisorbed first precursor from the chamber. Next, the second precursor is introduced in a pulse to the chamber. In some embodiments, the duration of the pulse of the second precursor is about 0.1 sec to about 2.0 sec, typically about 0.2 sec to about 1.2 sec, whereby the second precursor is chemisorbed onto the surface of the monolayer of the first precursor to form a monolayer of the second precursor thereon. The chamber is again purged using the constantly introduced rare gas and reactant gas for about 1.0 sec to about 4 sec (typically 1.5 sec to 3.5 sec) to remove the non-chemisorbed second precursor from the chamber. Since ALD is a self-limiting adsorption reaction process, the amount of deposited precursor molecules is determined by the number of reactive surface sites and is independent of the precursor exposure after saturation, and a supply of each precursor is such that the reactive surface sites are saturated thereby by each pulse. In some embodiments, the flow rate of the first and second precursors is about 10 sccm to about 2000 sccm (preferably about 100 sccm to about 500 sccm) including a carrier gas. RF power is then applied in a pulse to the chamber to generate radicals. In some embodiments, RF plasma exiting time is about 0.1 sec to about 4.0 see (preferably about 0.5 sec to about 3.0 sec) to cause surface reaction using the radicals to form a compound monolayer of the material. The chamber is again purged using the constantly introduced rare gas and reactant gas for about 0.5 sec to about 2.0 sec (typically about 0.7 sec to about 1.5 sec) to remove the non-reacted reactant from the chamber. According to the above cycle, GPC can be increased because before exposure to the radicals, two precursor molecules can be absorbed onto the surface in a thickness direction.

By repeating the above cycle, a film having a desired thickness can be obtained. In some embodiments, the thickness of the film is about 3 nm to about 50 nm, typically about 3 nm to about 20 nm (e.g., equivalent to about 84 cycles to about 834 cycles, typically about 84 cycles to about 334 cycles).

Embodiments are explained with reference to the drawings which are not intended to limit the present invention. FIG. 1 is a schematic view of an apparatus combining a plasma-enhanced ALD reactor and flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and, as necessary, LRF power of 5 MHz or less (400 kHz~500 kHz) 50 to one side, and electrically grounding 12 the other side, a plasma is excited between the electrodes. A temperature regulator (heater/cooling block) is provided in a lower stage 2 (the lower electrode), and a temperature of a substrate 1 placed thereon is kept constant at a given temperature. The upper electrode 4 serves as a shower plate as well, and reactant gas, rare gas, a first precursor and a second precursor are introduced into the reaction chamber 3 through gas flow controllers 21, 22, 23, and 63, respectively, and a pulse flow control valve 31 for the first precursor and a pulse flow control valve 61 for the second precursor, and further through the shower plate 4. Additionally, in the reaction chamber 3, an exhaust pipe 6 is provided through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). The type of film deposited on the substrate and the properties of the film vary depending on the type of precursors, the flow rate thereof, the frequencies of RF power, the special structure of the chamber, the electronic potential distribution, etc.

The embodiments will be explained with respect to preferred embodiments. However, the present invention is not limited to the preferred embodiments A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

EXAMPLES

Example 1

A dielectric layer having Si—C bonds was formed on a substrate (200 mm in diameter) having a pattern with an opening of 50 nm under the conditions shown below using the sequence illustrated in FIG. 2 and the PEALD apparatus illustrated in FIG. 1.

Tetrachlorodimethyldisilane (first precursor): 0.1 sccm
Divinyldimethylsilane (second precursor): 0.4 sccm
Hydrogen (reactant): 10 sccm
Helium (reactant): 1000 sccm
Seal helium: 100 sccm
Substrate temperature: 100° C.
High frequency RF power (a frequency of 13.56 MHz): 100 W
First precursor supply time: 1.0 sec supply
Second precursor supply time: 1.0 sec supply
Purge time after each precursor pulse: 3.0 sec
RF Plasma exciting time: 1.0 sec excite
Purge time after RE exciting pulse: 1.0 sec
Number of cycles: 334

The refractive index, growth rate, etch rate, and step coverage of the deposited film are shown in Table 2.

Example 2

Under conditions which were the same as in Example 1 except the following, a dielectric layer having Si—C bonds was formed on a substrate (200 mm in diameter).

Substrate temperature: 400° C.

The refractive index, growth rate, etch rate, and step coverage of the deposited film are shown in Table 2.

Example 3

Under conditions which were the same as in Example 1 except the following, a dielectric layer having Si—C bonds was formed on a substrate (200 mm in diameter).
CH4 (reactant): 100 sccm
Hydrogen (reactant): 10 sccm
Helium (reactant): 1000 sccm The refractive index, growth rate, etch rate, and step coverage of the deposited film are shown in Table 2.

Example 4

Under conditions which were the same as in Example 1 except the following, a dielectric layer having Si—C bonds was formed on a substrate (200 mm in diameter).
CH4 (reactant): 100 sccm
Hydrogen (reactant): 10 sccm
Helium (reactant): 1000 sccm
Substrate temperature: 400° C.

The refractive index, growth rate, etch rate, and step coverage of the deposited film are shown in Table 2.

Example 5

Under conditions which were the same as in Example 1 except the following, a dielectric layer having Si—C bonds was formed on a substrate (200 mm in diameter).
Divinyldimethylsilane (first precursor): 0.4 sccm
Tetrachlorodimethyldisilane (second precursor): 0.1 sccm The refractive index, growth rate, etch rate, and step coverage of the deposited film are shown in Table 2.

Example 6

Under conditions which were the same as in Example 1 except the following, a dielectric layer having Si—C bonds was formed on a substrate (200 mm in diameter).
Divinyldimethylsilane (first precursor): 0.4 sccm
Tetrachlorodimethyldisilane (second precursor): 0.1 sccm
Substrate temperature: 400° C.

The refractive index, growth rate, etch rate, and step coverage of the deposited film are shown in Table 2.

Comparative Example 1

Figure 3:
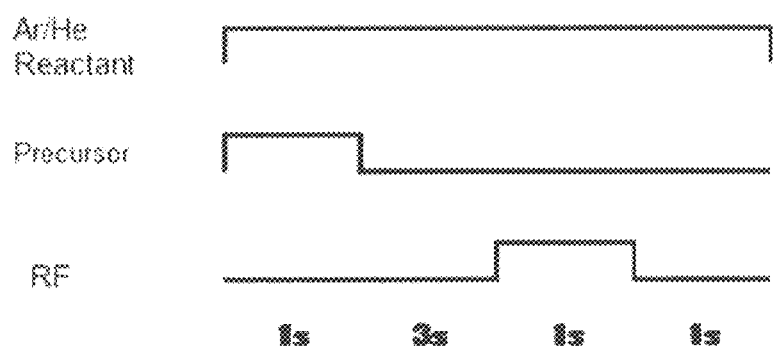
FIG. 3 shows a schematic process sequence of conventional PEALD in one cycle.

A dielectric layer having Si—C bonds was formed on a substrate (200 mm in diameter) under the condition shown below using the sequence illustrated in FIG. 3 and the PEALD apparatus illustrated in FIG. 1.
Tetrachlorodimethyldisilane (single precursor): 0.1 sccm
Hydrogen (reactant): 10 sccm
Helium (reactant): 1000 sccm
Seal helium: 100 sccm
Substrate temperature: 400° C.
High frequency RF power (a frequency of 13.56 MHz): 100 W
Precursor supply time: 1.0 sec supply
Purge time after the precursor pulse: 3.0 sec
RF Plasma exciting time: 1.0 sec excite
Purge time after RF exciting pulse: 1.0 sec
Number of cycles: 667

The refractive index, growth rate, etch rate, and step coverage of the deposited film are shown in Table 2.

The above conditions are summarized in Table 1 below:

TABLE 1

| Exam | Temp. (° C.) | | Si-containing precursor | RF power 13.56 MHz (W) | Reactant | SQ |
|---|---|---|---|---|---|---|
| 2 | 200 | 1$^{st}$ | Tetrachlorodimethyldisilane | 100 | H$_2$/He | FIG. 2 |
|   |     | 2$^{nd}$ | Divinyldimethylsilane |     |         |        |
| 3 | 400 | 1$^{st}$ | Tetrachlorodimethyldisilane | 100 | H$_2$/He | FIG. 2 |
|   |     | 2$^{nd}$ | Divinyldimethylsilane |     |         |        |
| 4 | 200 | 1$^{st}$ | Tetrachlorodimethyldisilane | 100 | CH$_4$/H$_2$/He | FIG. 2 |
|   |     | 2$^{nd}$ | Divinyldimethylsilane |     |         |        |
| 5 | 400 | 1$^{st}$ | Tetrachlorodimethyldisilane | 100 | CH$_4$/H$_2$/He | FIG. 2 |
|   |     | 2$^{nd}$ | Divinyldimethylsilane |     |         |        |
| 6 | 200 | 1$^{st}$ | Divinyldimethylsilane | 100 | H$_2$/He | FIG. 2 |
|   |     | 2$^{nd}$ | Tetrachlorodimethyldisilane |     |         |        |
| 7 | 400 | 1$^{st}$ | Divinyldimethylsilane | 100 | H$_2$/He | FIG. 2 |
|   |     | 2$^{nd}$ | Tetrachlorodimethyldisilane |     |         |        |
| Com. | 400 | — | Tetrachlorodimethyldisilane | 100 | H$_2$/He | FIG. 3 |

TABLE 2

| Exam | RI@633 nm | GPC (nm/cycle) | 100:1 DHF Etch rate (nm/min) | AR2 (Opening50 nm) Side/Bottom coverage |
|---|---|---|---|---|
| 2 | 2.01 | 0.06 | 0.08 | 89/95 |
| 3 | 1.98 | 0.04 | 0.04 | 92/96 |
| 4 | 1.76 | 0.05 | 0.06 | 88/94 |
| 5 | 1.77 | 0.05 | 0.09 | 92/95 |
| 6 | 1.89 | 0.08 | 0.07 | 88/92 |
| 7 | 1.92 | 0.06 | 0.05 | 90/94 |
| Com. | 2.02 | 0.03 | 0.06 | 93/96 |

As shown in Table 2, the films show the refractive indexes for SiC (1.6 to 2.2). Further, when using two precursors reactive with each other (one of which contains a halogen) in the improved ALD, GPC can increase significantly by 1.3 times to 2.7 times that in the conventional ALD without sacrificing etch rate and step coverage which are substantially comparable to those of the conventional ALD.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a silicon-containing dielectric film on a substrate by atomic layer deposition (ALD), comprising:
   (i) providing two precursors for forming a silicon-containing film, one precursor containing a halogen in its molecule, another precursor containing a silicon but no halogen in its molecule, said two precursors being reactive with each other in a gas phase;
   (ii) adsorbing a first precursor in a gas phase, which is one of the two precursors without the other of the two precursors, onto a substrate to deposit a monolayer of the first precursor;
   (iii) then adsorbing a second precursor in a gas phase, which is the other of the two precursors without the one of the two precursors, onto the monolayer of the first precursor to deposit a monolayer of the second precursor, wherein no radicals of a gas are supplied over the substrate between steps (ii) and (iii);
   (iv) exposing the monolayer of the second precursor to radicals of a treating gas to cause surface reaction with the radicals to form a compound monolayer of a silicon-containing film; and
   (v) repeating steps (ii) to (iv), which constitute one cycle of ALD, to form a silicon-containing dielectric film composed of multiple monolayers.

2. The method according to claim 1, wherein the one precursor is a precursor containing a silicon in its molecule.

3. The method according to claim 2, wherein the one precursor is a precursor containing a hydrocarbon in its molecule.

4. The method according to claim 1, wherein the one precursor is a silicon halide.

5. The method according to claim 4, wherein the one precursor is the first precursor.

6. The method according to claim 5, wherein the one precursor is a silicon halide.

7. The method according to claim 1, wherein the other precursor is a silicon alkylamide or aminosilane.

8. The method according to claim 1, wherein the treating gas is at least one gas selected from the group consisting of rare gas, hydrogen, nitrogen, ammonia, hydrocarbon, and halogenated carbon.

9. The method according to claim 8, wherein the treating gas is at least one gas selected from the group consisting of $N_2$, He, Ne, Ar, $H_2$, $NH_3$, $CH_4$, $C_xF_y$, $C_xCl_y$, $C_xBr_y$, and $C_xI_y$, wherein x and y are integers.

10. The method according to claim 1, wherein the radicals are radicals excited by plasma or thermally excited.

11. The method according to claim 10, wherein the radicals are constituted by hydrogen and nitrogen plasmas.

12. The method according to claim 10, wherein the radicals are radicals excited by plasma generated by RF power having a frequency of 400 kHz to 60 MHz.

13. The method according to claim 1, further comprising removing a non-adsorbed portion of the first precursor from the surface of the substrate after step (ii) before step (iii), removing a non-adsorbed portion of the second precursor from the surface of the substrate after step (iii) before step (iv), and removing a non-reacted portion of the reactant from the surface of the substrate after step (iv) before subsequent step (ii).

14. The method according to claim 1, wherein the temperature of the substrate is kept at 0 to 650° C. throughout the cycles.

15. The method according to claim 1, wherein the other precursor further contains a hydrocarbon in its molecule, and in step (iii), the second precursor is adsorbed onto the monolayer of the first precursor by an exchange reaction between the halogen of the one precursor and the hydrocarbon of the other precursor.

16. A method for forming a silicon-containing dielectric film on a substrate by atomic layer deposition (ALD), comprising:
   (i) providing two precursor for forming a silicon-containing film, one precursor containing a halogen in its molecule, another precursor containing a silicon but no halogen in its molecule, said two precursors being reactive with each other;
   (ii) adsorbing a first precursor, which is one of the two precursors without the other of the two precursors, onto a substrate to deposit a monolayer of the first precursor;
   (iii) then absorbing a second precursor, which is the other of the two precursors without the one of the two precursors, onto the monolayer of the first precursor to deposit a monolayer of the second precursor, wherein no radicals of a gas are supplied over the substrate between steps (ii) and (iii);
   (iv) exposing the monolayer of the second precursor to radicals of a treating gas to cause surface reaction with the radicals to form a compound monolayer of a silicon-containing film; and
   (v) repeating steps (ii) to (iv), which constitute one cycle of ALD, to form a silicon-containing dielectric film composed of multiple monolayers,
   wherein the one precursor is at least one precursor selected from the group consisting of dichloromethylsilane, tetrachlorodimethyldisilane, dichlorotetramethyldisilane, bisdichloromethylsilylethane, chloromethyldichloromethylsilane, bisdimethylchlorosilylethane, bisdichloromethylsilylethane, chloromethyltrimethylsilane, and bischloromethyldimethylsilane.

17. A method for forming a silicon-containing dielectric film on a substrate by atomic layer deposition (ALD), comprising:
   (i) providing two precursors for forming a silicon-containing film, one precursor containing a halogen in its molecule, another precursor containing a silicon but no halogen in its molecule, said two precursors being reactive with each other;
   (ii) adsorbing a first precursor, which is one of the two precursors without the other of the two precursors, onto a substrate to deposit a monolayer of the first precursor;
   (iii) then absorbing a second precursor, which is the other of the two precursors without the one of the two precursors, onto the monolayer of the first precursor to deposit a monolayer of the second precursor, wherein no radicals of a gas are supplied over the substrate between steps (ii) and (iii);
   (iv) exposing the monolayer of the second precursor to radicals of a treating gas to cause surface reaction with the radicals to from a compound monolayer of a silicon-containing film; and
   (v) repeating steps (ii) to (iv), which constitute one cycle of ALD, to form a silicon-containing dielectric film composed of multiple monolayers,
   wherein the other precursor is at least one precursor selected from the group consisting of vinyltrimethylsilane, trimethylsilylacetylene, bistrimethylsilylacetylene, and divinyldimethylsilane.

* * * * *